United States Patent [19]

Nishizawa

[11] 4,177,321
[45] Dec. 4, 1979

[54] SINGLE CRYSTAL OF SEMICONDUCTIVE MATERIAL ON CRYSTAL OF INSULATING MATERIAL

[75] Inventor: Jun-ichi Nishizawa, Sendai, Japan

[73] Assignee: Semiconductor Research Foundation, Japan

[21] Appl. No.: 907,290

[22] Filed: May 18, 1978

Related U.S. Application Data

[63] Continuation of Ser. No. 693,534, Jun. 7, 1976, abandoned, which is a continuation-in-part of Ser. No. 477,010, Jun. 6, 1974, abandoned.

[30] Foreign Application Priority Data

Jul. 25, 1972 [JP] Japan .................................. 47-74483

[51] Int. Cl.² ........................ H01L 21/20; B01J 17/02
[52] U.S. Cl. ..................................... 428/446; 428/428; 428/539; 428/432; 156/605; 156/606; 156/607; 156/DIG. 61; 156/78; 427/86; 427/87; 148/175
[58] Field of Search ............................ 427/82, 86, 87; 156/605, 606, 607, DIG. 61, 78; 148/175; 428/446, 428, 432, 539

[56] References Cited

U.S. PATENT DOCUMENTS

| 3,413,145 | 11/1968 | Robinson | 148/175 |
| 3,414,434 | 12/1968 | Marascuit | 148/175 |
| 3,424,955 | 1/1969 | Seiter et al. | 148/175 |
| 3,493,443 | 2/1970 | Cohen | 148/175 |
| 3,589,936 | 6/1971 | Tramposch | 148/175 |
| 3,655,439 | 4/1972 | Seiter | 148/175 |
| 3,658,586 | 4/1972 | Wang | 148/175 |
| 3,736,158 | 5/1973 | Cullen | 148/175 |
| 3,796,597 | 3/1974 | Porter | 148/175 |

OTHER PUBLICATIONS

Edel et al., *Stres Relief by Counterdoping*, IBM Tech. Disclosure, vol. 13, No. 3, p. 632 (1970).
Edel, *Stacking . . . Layer*, IBM Tech. Disclosure Bull., vol. 14, No. 5, (10–1971), p. 1654.
Light et al., *Stress Free Hetero-Epitaxial Layer*, IBM Tech. Discl. Bull., vol. 12, No. 9, p. 1496 (1970).
Zaininger et al., *MOS . . . Low Aluminum-Rich Spinel*, Solid State Electronic, vol. 13, p. 943 (1970).

*Primary Examiner*—Michael F. Esposito
*Attorney, Agent, or Firm*—Robert E. Burns; Emmanuel J. Lobato; Bruce L. Adams

[57] ABSTRACT

A grown crystal structure comprises a single crystal of semiconductive material having a given lattice constant grown on a spinel crystal substrate having a different lattice constant. A substance is added to one or both of the crystals and has suitable properties relative to the crystals to effectively reduce lattice strains developed in the grown crystal structure due to mismatch of the lattice constants of both crystals.

9 Claims, 1 Drawing Figure

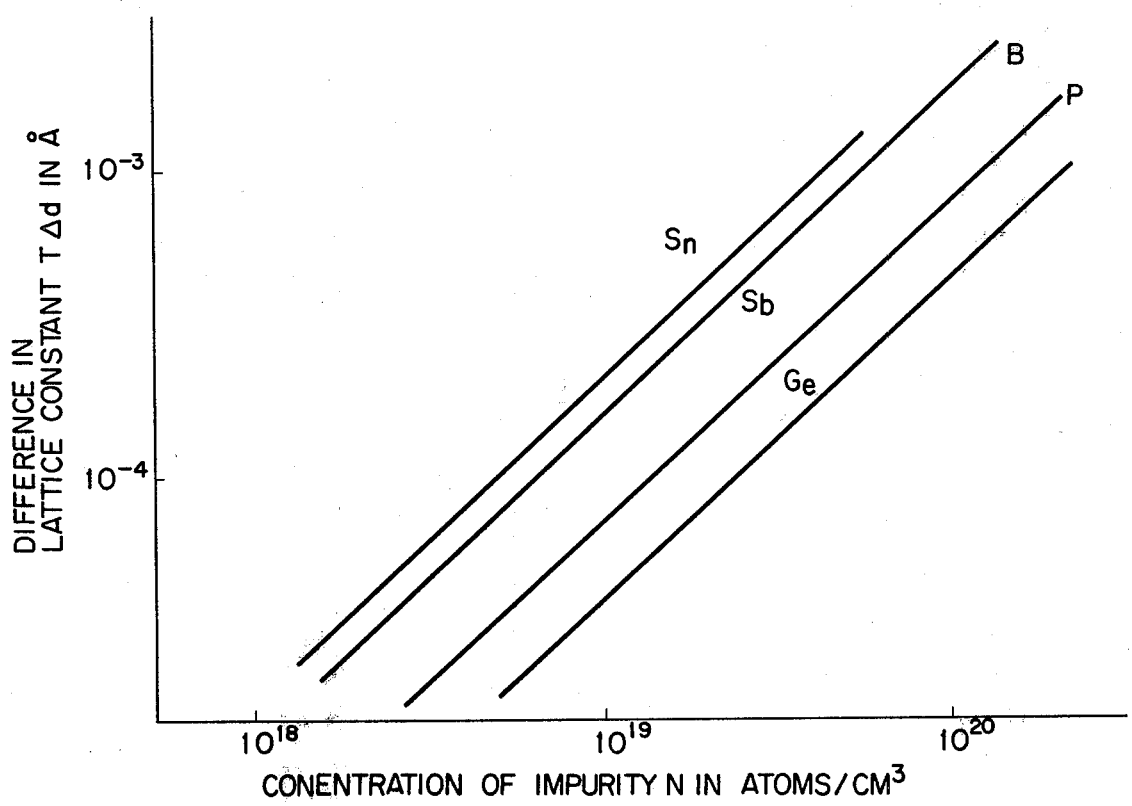

SINGLE CRYSTAL OF SEMICONDUCTIVE MATERIAL ON CRYSTAL OF INSULATING MATERIAL

This is a continuation, of application Ser. No. 693,534, filed June 7, 1976 now abandoned which is a CIP application of Ser. No. 477,010 filed June 6, 1974 now abandoned.

BACKGROUND OF THE INVENTION

This invention relates to a single crystal of semiconductive material grown on a substrate formed of a crystal of electrically insulating material and more particularly to such a single crystal having a reduced difference in lattice constant between the single crystal and the insulating crystal.

It is well known that, for example, with circuit elements formed in a two-dimensional pattern of a single crystal of semiconductive material as in integrated circuits, each of the circuit elements is electrically insulated from the other elements or its substrate by the associated pn junction. In such a case, stray capacitances and/or deteriorated insulation may frequently adversely affect the characteristics of the resulting semiconductor devices and more particularly the frequency response thereof or the noise therefrom. Recently, therefore, it is being widely practiced to use single crystals of silicon, for example, grown upon a substrate of electrically insulating materials such as sapphire ($Al_2O_3$), spinel ($MgO.Al_2O_3$ or $MgAl_2O_4$) or quartz ($SiO_2$). When a single crystal of semiconductive material has been grown on a substrate of electrically insulating material as above described, the substrate ensures that circuit elements disposed on the single crystal can be extremely easily electrically insulated from one another while any parasitic capacitance involved can be kept extremely low.

However the crystal growth on such an insulating substrate, known as the so-called heterojunction, involves a large misfit between the two crystal structures. The misfit is very large as compared with, for example, the growth of silicon on a silicon substrate or "Si on Si" due to a difference in lattice constant between the grown material and the material of the substrate. In other words, the layer grown on the substrate has therein defects which are due to strains developed in the layer during its growth. For example, silicon has a lattice constant of about 5.4302 Å and is of a face centered cubic structure whereas sapphire, which is one of the electrically insulating materials widely used as a substrate, is of a rhombohedral structure having lattice constants of a=4.758 Å and c=12.911 Å. Also spinel, which is used for the same purpose, is of the face centered cubic structure and has a lattice constant of 8.088 Å. Upon growing a single crystal of silicon on a substrate formed of such an insulating material, it is impossible to bond all silicon atoms with all atoms of insulating material and therefore a difference in lattice constant between the two materials per se does not indicate a measure of the mismatch. Although the mechanism by which dissimilar lattices are mismatched is complicated as compared with similar lattices, as in "Si on Si", it is said that the mismatch for dissimilar lattices is in the order of from 1 to 2% as a result of experiments or on the basis of certain assumptions. For "Si on Si" the doping of the silicon with an impurity exhibiting the effect of decreasing the lattice constant, for example, phosphorous, causes defects or the like due to the misfit. The misfit may occur in the order of $10^{-2}$% or less. Therefore the mismatch associated with electrically insulating materials is decidedly large. Accordingly, whenever factors deteriorating the crystal, for example the contamination with foreign matters are removed, the grown layer has high strains developed therein upon forming the lattice. This greatly affects noise, carrier mobility, lifetime of carriers, etc. relating to the grown layer.

Similarly, with gallium arsenide (GaAs) grown on a spinel ($MgAl_2O_4$), a misfit or mismatch ranges from 4 to 5% and therefore is further increased to additionally deteriorate the crystallographic properties of the grown gallium arsenide as compared with a silicon crystal grown thereon. Also it is well known that sapphire can be used as electrically insulating crystals but the predetermined relationship exists between the same and, for example, silicon grown thereon in terms of the crystal face and crystallographic direction. For example, a silicon crystal grown on sapphire has a crystal face (111) grown on a crystal face (0001) of the sapphire and a crystallographic direction [110] parallel to that represented by [11$\bar{2}$0] of the latter. Further, silicon atoms are arranged at intervals of 3.85 Å in the direction [1$\bar{1}$0], while aluminum atoms are arranged at intervals of 4.75 Å in the direction [1120]. Assuming that the silicon atoms in the silicon crystal correspond to the aluminum atoms in the sapphire, the resulting mismatch may be as large as in the order of 20%. Also in this case, the silicon crystal has a crystal face (100) grown on a crystal face ($\bar{1}$012) of the sapphire and a crystallographic direction [100] parallel to both directions [1$\bar{2}$10] and [10$\bar{1}$1] thereof and a crystallographic direction [110] parallel to a direction [2$\bar{2}$01] of the sapphire. Further the silicon crystal has interatomic intervals of 5.43 and 3.82 Å in the crystallographic directions [100] and [110], respectively. On the other hand, the sapphire has interatomic intervals for alluminum of 4.75, 5.2 and 3.52 Å in the crystallographic directions [1$\bar{2}$10], [10$\bar{1}$1] and [2$\bar{2}$01] of the same and therefore mismatches in those directions reach 12%, 4% and 8% respectively. In this way, a silicon crystal grown on sapphire has different mismatches in different crystallographic directions and the magnitudes thereof are very large.

The misfit due to a difference in lattice constant between dissimilar lattices might have been previously researched but it has not been heretofore considered that a layer of semiconductive material is grown on a substrate formed of an electrically insulating material while the difference in lattice constant between the semiconductor layer and the insulating crystal undergoes a decrease. This is because a heterojunction exists at the interface between the layer and crystal. However it is to be understood that the single crystal disposed on such an insulating member should be necessarily a perfect crystal of a crystal free from any defect. Such single crystals will be demanded in the future.

SUMMARY OF THE INVENTION

Accordingly it is an object of the present invention to provide an improved single crystal of semiconductive material grown on a crystal of electrically insulating material and being of high quality due to the marked reduction in the difference in lattice constant or the mismatch between both crystals.

In order to accomplish this object, the present invention utilizes any one or ones of the following techniques.

A first technique is to control the lattice constant in an electrically insulating crystal on which a single crystal of semiconductive material is grown. A second technique is to control the lattice constant of a single crystal of semiconductive material without affecting the electrical characteristics thereof. A third technique is to combine the first technique with the second technique. In the first technique, the electrically insulating crystal may change in composition of its material. Alternatively, the insulating material may have added thereto a substance different in atomic radius or ionic radius from an element or elements forming the same. Also the electrically insulating crystal may be added with another electrically insulating crystal different in lattice constant therefrom. If desired, a selected one of the measures just described may be combined with either or both of the remaining measures. In the second technique, the single crystal of semiconductive material may be added with a substance different in atomic radium or ionic radius from an element or elements forming the semiconductive material and preferably belonging to the same Group of the Periodic Table as at least one of the elements forming the semiconductive material.

Preferably the lattice constant of the electrical insulating crystal may be initially changed to coarsely remove or alleviate the difference in lattice constant between both crystals according to the first technique and then the lattice constant of the semiconductive material is more precisely controlled according to the second technique in order to completely eliminate the difference in lattice constant between both crystals.

BRIEF DESCRIPTION OF THE DRAWING

The present invention will become more apparent from the following detailed description taken in conjunction with the accompanying drawing in which the single FIGURE is a graph illustrating a change in lattice constant of silicon plotted against the concentration of certain impurities added to the silicon.

DESCRIPTION OF THE PREFERRED EMBODIMENTS

In order to decrease the difference in lattice constant between an electrically insulating material of a substrate in the form of a crystal and a semiconductive material of a single crystal to be grown on the substrate, the three techniques outlined above may be employed. One typical technique according to the invention will now be described in terms of silicon grown on a spinel substrate.

Spinels presently employed with semiconductive materials are mixed crystals consisting of magnesium oxide (MgO) and aluminum oxide ($Al_2O_3$) and their stoichiometric composition is expressed by $MgO.Al_2O_3$. However the composition of spinels practically used may range from $MgO.Al_2O_3$ to $MgO.4Al_2O_3$. Such spinels having compositions deviating from the stoichiometric composition thereof can be generally expressed by $MgO.nAl_2O_3$ where n is greater than one and may be grown according to the Czochralski process, flame fusion technique or the like. Those spinels are disclosed in U.S. Pat. No. 3,796,597 to Porter et al., U.S. Pat. No. 3,658,586 to Wang and U.S. Pat. No. 3,655,439 to Seiter. The larger the amount of $Al_2O_3$ the more the lattice constant from that for the stoichiometric $MgO.Al_2O_3$ whose lattice constant has a value of 8.088 A. Also the mismatch is of about 1% for $MgO.Al_2O_3$ and of about 1.9% for $MgO.3.3Al_2O_3$. In addition, the precipitation of $Al_2O_3$ and the diffusion of aluminum into the grown layer comes into question. For these reasons, the use of the stoichiometric composition is preferable. Even in this event, however, the mismatch is too large. More specifically, in a silicon crystal grown on a stoichiometric spinel ($MgO.Al_2O_3$), three unit cells of the silicon substantially correspond to two unit cells of the spinel and are about 0.8% greater than the latter. In order to reduce such a mismatch, it is necessary to increase the lattice constant of the spinel. Thus the use of a spinel expressed by $MgO.nAl_2O_3$ where n is less than one is preferable. Since the solubility of MgO to $MgO.Al_2O_3$ is not large, the MgO can not be added to the $MgO.Al_2O_3$ at will. However it is possible to render n less than one by using the pulling-up technique with a vapor of MgO applied. Alternatively the addition of magnesium (Mg) alone permits an increase in lattice constant. Thus it will readily be understood that a high-quality silicon single-crystal can be grown on such a spinel by adding a substance to silicon to decrease the lattice constant of the silicon as will be described hereinafter.

Spinel $MgO.Al_2O_3$ is a substance consisting of aluminum, magnesium and oxygen bonded to one another. More precisely speaking, the spinel should be called the spinel structure of aluminum and magnesium. Many substances having the spinel structure expressed by $XY_2O_4$ exist, such as $ZnO.Al_2O_3$, $MgCr_2O_4$, $NiCr_2O_4$, $ZrSiO_4$, $TiZn_2O_4$, $ZnFe_2O_4$, $SnCo_2O_4$, $CdCr_2O_4$ etc. In addition, there are known substances having the inverse spinel structure and expressed by $Y(XY)O_4$.

In order to reduce the mismatch of a semiconductor crystal relative to an associated spinel crystal, one can first determine a direction in which the lattice constant of the spinel is increased or decreased by comparing both crystals with each other in conjunction with the lattice constant and then select that composition of the spinel suited to the determined direction, that is, effective for decreasing the difference in lattice constant between both crystals in that direction. For example, a gallium arsenide (GaAs) crystal grown on an electrically insulating crystal formed of $MnO.nFe_2O_3$ has a lattice constant of 5.65 Å. For $n=1$, the $MnO.nFe_2O_3$ has a lattice constant of 8.51 Å and three unit cells of gallium arsenide (GaAs) correspond to two unit cells of $MnO.nFe_2O_3$. This means that the former is smaller by about 0.4% than the latter. Therefore the mismatch between both crystals can be reduced by increasing the amount of MnO in the $MnO.nFe_2O_3$ to decrease the lattice constant of the spinel.

The control of the lattice constant of electrically insulating crystals through the addition of another substance thereto will now be described, by way of example, in conjunction with the growth of a silicon (Si) crystal on a spinel ($MgO.Al_2O_3$). In this event, the mismatch between the two can be reduced by adding an element that increases the lattice constant of the spinel to the Mg-site of the spinel. Such an element is selected from the group consisting of calcium (Ca), zinc (Zn), strontium (Sr), cadmium (Cd), barium (Ba), tin (Sn), manganese (Mn), iron (Fe), cobalt (co), lead (Pb) etc. which are larger in ionic radius (or atomic radius) than $Mg^{2+}$ ions. Alternatively, an element selected from the group consisting of scandium (Sc), gallium (Ga), yttrium (Y), indium (In), thallium (Tl), titanium (Ti), iron (Fe), cobalt (Co) etc. may be added to the Al-site of the spinel, those elements being larger in ionic radius (or atomic radius) than $Al^{3+}$ ions. If desired, the MgO.Al- $_2O_3$ may have added thereto zirconium (Zr), hafnium (Hf) or the like which are larger in ionic radius (or atomic radius) than either of magnesium (Mg) and aluminum (Al). For example, $MgAl_2O_4$ has a lattice constant of about 8.11, 8.14 or 8.15 Å with zirconium (Zr) added thereto in an amount of 2.9, 5.7 or 7.14 molar percent respectively. Thus it will be appreciated that the addition of zirconium (Zr) to $MgAl_2O_4$ in forming a substrate distinctively decreases the mismatch between the substrate and silicon crystal grown thereon as compared with substrates formed of $MgAl_2O_4$ alone. It has been found that the use of $MgAl_2O_4$ added with from 6 to 7 molar percent of zirconium (Zr) is most preferable because the resulting mismatch to silicon is not more than 0.1%.

Also if Sn ions larger than Mg ions occupy the Mg-site of $MgAl_2O_4$, then a spinel expressed by $Mg_xSn_{1-x}Al_2O_4$ results. When x is equal to 0.8 such a spinel has a lattice constant of about 8.14 Å and therefore the mismatch between the same and silicon grown thereon becomes very small.

Thus it is seen that a substance is added to the particular spinel to control the lattice constant thereof. When the spinel has a controlled lattice constant of 8.145 Å, it exhibits a null mismatch to silicon for the reason that twice the lattice constant of the spinel is equal to three times the lattice constant of the silicon.

It is to be understood that the foregoing is equally applicable to semiconductive materials other than silicon, such as gallium phosphide (GaP), gablium arsenide (GaAs), germanium (Ge) etc. In this case it is noted that the lattice constant of the spinel magnitudes of be controlled to 8.175, 8.48 or 8.475 A for GaP, GaAs, Ge respectively, and such results in a null mismatch.

As above described, electrically insulating crystals can be added with electrically insulating crystals different in lattice constant therefrom for the purpose of controlling the lattice constant thereof. For example, when a spinel ($MgAl_2O_4$) having a lattice constant of 8.088 Å is added with $TiZn_2O_4$ having a lattice constant of 8.445 Å in a proportion of 84 to 16 in molar percent, the resulting mixed crystal or spinel has a lattice constant of about 8.145 Å with two unit cells of the spinel substantially corresponding to three unit cells of silicon. It is to be understood that the lattice constant of the mixed crystal thus formed is permitted to be precisely controlled by the use of another substance such as above described. It is also to be understood that, for the growth of silicon (Si), gallium phosphide (GaP), or the like on a spinel ($MgAl_2O_4$), a crystal mixed with that spinel is not restricted to $TiZn_2O_4$ and that it is required only to be larger in lattice constant than the spinel ($MgAl_2O_4$). Examples of such crystals, in addition to $TiZn_2O_4$, comprise $MgFe_2O_4$ with a lattice constant of 8.36 Å, $MnFe_2O_4$ with a lattice constant of 8.51 Å, $Fe_3O_4$ with a lattice constant of 8.39 Å, $CoFe_2O_4$ with a lattice constant of 8.38 Å etc.

By considering the diffusion of a metal or metals from a spinel into a silicon layer being grown thereon, it will be far preferable from the standpoint of auto-doping that an element or elements of the IV Group of the Periodic Table such as silicon, germanium, tin, lead, titanium, zirconium, hafnium etc. be added to the spinels as compared with other elements added to the latter. This is because the IV Group elements behave as neutral elements with respect to silicon.

It will readily be understood that if a single crystal of a III-IV compound such as gallium arsenide or gallium phosphide is to be grown on a spinel, that an element of the III or V group is preferably included in the substance to be added to the spinel or in at least one part of an electrically insulating crystal to be added to the spinel.

While the present invention has been described in conjunction with the control of the lattice constant of spinels forming the substrate, it is to be understood that changing the lattice constant of semiconductor crystals grown on spinels is also effective for accomplishing the object of the present invention. A change in lattice constant of silicon due to the addition of an impurity has been well researched heretofore. For example, an increase and a decrease in the lattice constant of silicon or the expansion and contraction thereof can be relatively well described such that the particular impurity substitutionally enters the lattice of silicon due to a difference in the covalent radius between silicon and the impurity atoms upon the silicon making the covalent bond with that impurity.

For example, silicon (Si) has a covalent radius of 1.17 Å whereas tin (Sn) and germanium (Ge) belonging to Group IV of the Periodic Table have covalent radii of 1.40 and 1.22 Å respectively. Also boron (B) and aluminum (Al) belonging to Group III have covalent radii of 0.88 and 1.26 Å respectively and phosphorous (P) and antimony (Sb) belonging to the Group V have covalent radii of 1.10 and 1.30 Å respectively. Therefore the lattice constant of silicon is increased by adding tin, germanium, aluminum, antimony to the silicon, whereas it is descreased with the addition of boron or phosphorous. The single FIGURE of the drawing shows an absolute value of a change in lattice constant of silicon in Å (along the ordinate) plotted against an impurity concentration N in atoms per cubic centimeter (along the abscissa) for the impurities of tin (Sn) germanium (Ge) boron (B) phosphorous (P) and antimony (Sb). Curves depict the calculated values in on a logarithmic scale and coincide very well with those described on the basis of corresponding experimental values. For example, the curve labelled Sn describes a change in lattice constant caused from the addition of tin. The similar effect can be expected with carbon (C) and lead (Pb) belonging to the IVb Group and also with titanium (Ti), zirconium (Zr) and hafnium (Hf) belonging to the IVa Group of the Periodic Table.

However, phosphorous, boron etc. are impurities for imparting a specific conductivity type to silicon and the use of any of such impurities results in the inconsistency of the carrier density required for a single crystal of silicon in view of the design of the particular semiconductor device with an impurity density required for eliminating a mismatch between the silicon crystal and an associated spinel. Therefore it is advantageous that the impurity added to silicon partly comprises a Group IV element which does not electrically affect the silicon. This is true in the case of semiconductive Group III-V compounds such as gallium arsenide (GaAs) gallium phosphide (GaP) etc. That is, a single crystal of a Group III-V compound less in mismatch and having any desired carrier density can be grown on a spinel through the addition of an element belonging to the same group as at least one of elements forming the semiconductor crystal. That is, such an element may be of the III or V Group.

While the present invention has been described in conjunction with each of the techniques of growing single crystals of semiconductive material on respective spinels so as to reduce the mismatch between the crystal and the spinel, it is to be understood that a combination of selected ones of those techniques can be most preferably used to provide a single crystal of semiconductive material grown on a spinel while the single crystal has any desired carrier density and no mismatch occurs therebetween. As an example, a crystal of $MgAl_2O_4$ mixed with $Fe_2SiO_4$ in a molar proportion of 40 to 60 is first produced as by the pulling-up or floating zone technique. The mixed crystal thus produced has a lattice constant of about 8.14 Å and provides a spinel substrate. Then a mixed gas of silane $(SiH_4)$ and hydrogen $(H_2)$ is passed over the substrate to deposit silicon (Si) thereon at about 1100° C. The resulting silicon crystal has three unit cells of silicon bonded to two unit cells of the spinel with no mismatch occurring between the crystal and spinel.

If in this case a silicon crystal is required to have an electron density of $10^{19}$ atoms $cm^{-3}$ the crystal can be grown on a spinel from a gaseous material including one part of $PH_3$, 1.5 parts of $GeH_4$ and 5000 parts of $SiH_4$. When the spinel has a lattice constant exceeding 8.14 Å, the $GeH_4$ is increased in amount. For a given impurity and a given impurity density, silicon can be, of course, grown on a spinel having a suitable substance preliminarily added thereto to be adjusted in lattice constant.

Also where gallium arsenide (GaAs) is grown on a spinel $(MnFe_2O_4)$, iron (Fe) is added to the Mn-site thereof to reduce its lattice constant to about 8.48 Å. The gallium arsenide is grown on the substrate thus prepared according to the vapor growth technique utilizing the chemical decomposition of a gaseous material including $(CH_3)_3Ga-AsCl_3$ and $H_2$. The grown gallium arsenide is substantially free from a mixmatch. When gallium arsenide is to be added with tellurium (Te) which is greater in atomic radius than gallium (Ga) and arsenic (As), it is required only to additionally add $PcL_3$ to the gaseous material as above described. Gallium arsenide (GaAs) may be equally grown on a spinel according to solution growth technique.

The growth of other semiconductive compounds such as gallium phosphide (GaP) can be accomplished in the similar manner as above described.

The present invention is equally applicable to electrically insulating substrates formed of sapphire. As above described, a silicon crystal grown on sapphire includes a crystal face (1111) grown on a crystal face (0001) of the sapphire and a crystallographic direction [1$\bar{1}$0] parallel to a crystallograhic direction [11$\bar{2}$0] of the sapphire. In this direction a mismatch between the silicon and the sapphire is of about 20% with interatomic intervals for aluminum atoms in the sapphire being larger. In order to decrease these interatomic intervals for aluminum atoms, boron (B) which is smaller in atomic radius than aluminum can be added to the sapphire. This addition of boron may be effected during the growth of the sapphire according to the ion implantation or pulling-up technique. Alternatively, the sapphire may be added with boron oxide $(B_2O_3)$ to form a mixed crystal.

As above described, silicon having a crystal face (100) grown on a crystal face (10$\bar{1}$2) of a sapphire has crystallographic directions [100], parallel to both crystallographic directions [1$\bar{2}$10] and [10$\bar{1}$1] of the sapphire and a crystallographic direction [110] parallel to a crystallographic direction [2$\bar{2}$01] thereof. In thos directions, mismatches are of 12.4 and 8% respectively and interatomic intervals for silicon atoms is larger. An increase in lattice constant of the sapphire will reduce the mismatch but different mismatches have occurred in the different directions. However it has been found that the resulting silicon crystal is improved in crystallographic properties by eliminating the mismatch in at least one of the required directions. For example, in order to equal the interatomic interval in the direction [100] of the silicon to that in the direction [10$\bar{1}$1] of the sapphire, ilmenite may be mixed with the sapphire to increase the lattice constants of the sapphire. This is because the ilmenite expressed by $ABO_3$, for example, $FeTiO_3$ is idential in crystallographic configuration to the sapphire and larger in lattice constant in each direction than the sapphire. Alternatively indium (In) thallium (tl), cobalt (Co), yttrium (Y) or the like may be added to the sapphire, those elements being larger in atomic radius than aluminum (Al). Of course, it is possible to add to the silicon an impurity smaller in atomic radius than silicon to reduce the mismatch. Then the mismatch thus reduced can become quite null with respect to the sapphire adjusted in lattice constant.

The measure as above described in equally applicable to semiconductive materials other than silicon, for example, gallium arsenide (GaAs), gallium phosphide (GaP) etc.

While the present invention has been described in conjunction with electrically insulating crystals formed of spinels or sa-phire, it is to be understood that it is equally applicable to a variety of electrically insulating material such as quartz ($\alpha$-$SiO_2$), zircon ($ZrSiO_4$), carborundum ($\alpha$-SiC), beryllium oxide (BeO) etc. Also it is to be understood that the present invention is not restricted to silicon, gallium arsenide (GaAs), and gallium phosphide (GaP) and that it is equally applicable to other semiconductive materials such as germanium (Ge), indium phosphide (InP) mercury tulluride (HgTe), Cadmium sulfide (CdS) etc.

What I claim is:

1. A grown crystal structure comprising: a spinel crystal having a lattice constant, a single crystal of semiconductive material having another lattice constant different from that of said spinel crystal and grown on said spinel crystal, said spinel crystal being selected from the group consisting of $MgO.nAl_2O_3$ where n is less than one or $MgO.Al_2O_3$ where the magnesium is present in stoichiometrically excessive amount, and means comprising at least a portion of said spinel crystal adjacent to said single crystal having a changed composition with respect to the remainder thereof for effectively reducing lattice strains developed in the grown crystal structure due to mismatch of the lattice constants between both said single and spinel crystals without adversely affecting the electrical characteristics of said single crystal of semiconductive material.

2. A grown crystal structure comprising: a spinel crystal having a lattice constant, a single crystal of semiconductive material having another lattice constant different from that of said spinel crystal and grown on said spinel crystal, and at least one substance added to at least one of said single and spinel crystals at least in an interface portion with the other crystal and having an ionic or atomic radius sufficiently different from that of at least one of the elements forming said crystal to which it is added and being present in an amount effective to reduce lattice strains developed in the grown crystal structure due to mismatch of the lattice constants between both said crystals without adversely affecting the electrical characteristics of said single crystal of semiconductive material, said one substance belonging to the same Group of the Periodic Table as at least one of the elements forming said single crystal of semiconductive material.

3. A grown crystal structure according to claim 2; wherein said single crystal is formed of a Group III-V compound and said one substance is selected from the group consisting of Group III elements and Group V elements of the Periodic Table.

4. A grown crystal structure comprising: a spinel crystal having a lattice constant, a single crystal of semiconductive material having another lattice constant different from that of said spinel crystal and grown on said spinel crystal, and at least one substance added to at least one of said single and spinel crystals at least in an interface portion with the other crystal and having an ionic or atomic radius sufficiently different from that of at least one of the elements forming said crystal to which it is added and being present in an amount effective to reduce lattice strains developed in the grown crystal structure due to mismatch of the lattice constants between both said crystals without adversely affecting the electrical characteristics of said single crystal of semiconductive material, said spinel crystal being formed of $MgAl_2O_4$ and said single crystal being formed of silicon, and wherein said one substance is selected from the group consisting of carbon (C), germanium (Ge), tin (Sn), lead (Pb), titanium (Ti), hafnium (Hf) and zirconium (Zr).

5. A grown crystal structure comprising: a spinel crystal having a lattice constant, a single crystal of semiconductive material having another lattice constant different from that of said spinel crystal and grown on a spinel crystal, and means comprising at least one other spinel crystal having another lattice constant different from that of said first-mentioned spinel crystal and mixed with said first-mentioned spinel crystal at least in an interface portion with said single crystal for effectively reducing lattice strains developed in the grown crystal structure due to mismatch of the lattice constants between both said single and first-mentioned spinel crystals without adversely affecting the electrical characteristics of said single crystal of semiconductive material, said other spinel crystal includi ng an element belonging to the same Group of the Periodic Table as at least one of the elements forming said single crystal.

6. A grown crystal structure according to claim 5; wherein said first-mentioned spinel crystal is formed of $MgAl_2O_4$ and said other spinel crystal has a lattice constant larger than that of the $MgAl_2O_4$.

7. A grown crystal structure comprising: a spinel crystal having a lattice constant, a single crystal of semiconductive material having another lattice constant different from that of said spinel crystal and grown on said spinel crystal, and means comprising at least one other spinel crystal having another lattice constant different from that of said first-mentioned spinel crystal and mixed with said first-mentioned spinel crystal at least in an interface portion with said single crystal for effectively reducing lattice strains developed in the grown crystal structure due to mismatch of the lattice constants between both said single and first-mentioned spinel crystals without adversely affecting the electrical characteristics of said single crystal of semiconductive material, said single crystal including a substance selected from the group consisting of silicon, germanium, and Group III-V compounds.

8. A grown crystal structure comprising: a sapphire crystal having a lattice constant, a single crystal of semiconductive material having another lattice constant different from that of said sapphire crystal and grown on said sapphire crystal, and at least one substance added to at least one of said single and sapphire crystals at least in an interface portion with the other crystal and having an ionic or atomic radius sufficiently different from that of at least one of the elements forming said crystal to which it is added and being present in an amount effective to reduce lattice strains developed in the grown crystal structure due to differences in the interatomic spacing between both said crystals by changing the interatomic spacing in one crystallographic direction of at least one of said single and sapphire crystals without adversely affecting the electrical characteristics of said single crystal of semiconductive material, the added substance comprising an electrically insulative crystal having the same crystal structure as that of said sapphire crystal and including an element belonging to the same Group of the Periodic Table as said semiconductive material.

9. A grown crystal structure comprising: a sapphire crystal having a lattice constant, a single crystal of semiconductive material having another lattice constant different from that of said sapphire crystal and grown on said sapphire crystal, and at least one substance added to at least one of said single and sapphire crystals and having an ionic or atomic radius sufficiently different from that of at least one of the elements forming said crystal to which it is added and being present in an amount effective to reduce lattice strains developed in the grown crystal structure due to differences in the interatomic spacing between both said crystals by changing the interatomic spacing in one crystallographic direction of at least one of said single and sapphire crystals without adversely affecting the electrical characteristics of said single crystal of semiconductive material, said single crystal comprising a substance selected from the group consisting of silicon, germanium, and Group III-V compounds.

* * * * *